(12) United States Patent
Chinthakindi et al.

(10) Patent No.: US 7,713,792 B2
(45) Date of Patent: May 11, 2010

(54) FUSE STRUCTURE INCLUDING MONOCRYSTALLINE SEMICONDUCTOR MATERIAL LAYER AND GAP

(75) Inventors: Anil Kumar Chinthakindi, Haymarket, VA (US); Deok-Kee Kim, Bedford Hills, NY (US); Chandrasekharan Kothandaraman, Hopewell Junction, NY (US); Byeongju Park, Plainview, NY (US)

(73) Assignee: International Business Machines Corporation, Armonk, NY (US)

( * ) Notice: Subject to any disclaimer, the term of this patent is extended or adjusted under 35 U.S.C. 154(b) by 24 days.

(21) Appl. No.: 11/870,007

(22) Filed: Oct. 10, 2007

(65) Prior Publication Data

US 2009/0096059 A1    Apr. 16, 2009

(51) Int. Cl.
H01L 21/02    (2006.01)
H01L 29/00    (2006.01)

(52) U.S. Cl. ............... 438/132; 257/529; 257/E29.001; 257/E21.002; 438/601

(58) Field of Classification Search .................. 438/132
See application file for complete search history.

(56) References Cited

U.S. PATENT DOCUMENTS

| | | | |
|---|---|---|---|
| 4,908,692 A | 3/1990 | Kikuchi et al. | |
| 5,808,351 A | 9/1998 | Nathan et al. | |
| 5,903,041 A | 5/1999 | La Fleur et al. | |
| 6,219,215 B1 | 4/2001 | Bertin et al. | |
| 6,274,440 B1 | 8/2001 | Arndt et al. | |
| 6,337,507 B1 | 1/2002 | Bohr et al. | |
| 6,624,499 B2 | 9/2003 | Kothandaraman et al. | |
| 6,633,055 B2 | 10/2003 | Bertin et al. | |
| 6,927,472 B2 | 8/2005 | Anderson et al. | |
| 7,029,955 B2 | 4/2006 | Kothandaraman | |
| 7,153,712 B1 | 12/2006 | Sidhu et al. | |
| 7,242,072 B2 | 7/2007 | Kothandaraman et al. | |
| 2006/0038297 A1 | 2/2006 | Usami et al. | |
| 2008/0079113 A1* | 4/2008 | Chinthakindi et al. | 257/530 |
| 2008/0169529 A1* | 7/2008 | Kim et al. | 257/529 |

FOREIGN PATENT DOCUMENTS

JP    2005354054 A    12/2005

OTHER PUBLICATIONS

U.S. Appl. No. 11/538,170 Title: Fuse Structure Including Cavity And Methods For Fabrication Thereof Date Filed: Oct. 3, 2006 Anil K. Chinthakindi, et al.

* cited by examiner

*Primary Examiner*—Zandra Smith
*Assistant Examiner*—Lawrence Tynes, Jr.
(74) *Attorney, Agent, or Firm*—Scully, Scott, Murphy & Presser, P.C.; Ian D. MacKinnon, Esq.

(57) ABSTRACT

A fuse structure, a method for fabricating the fuse structure and a method for programming a fuse within the fuse structure each use a fuse material layer that is used as a fuse, and located upon a monocrystalline semiconductor material layer in turn located over a substrate. At least part of the monocrystalline semiconductor material layer is separated from the substrate by a gap. Use of the monocrystalline semiconductor material layer, as well as the gap, provides for enhanced uniformity and reproducibility when programming the fuse.

11 Claims, 6 Drawing Sheets

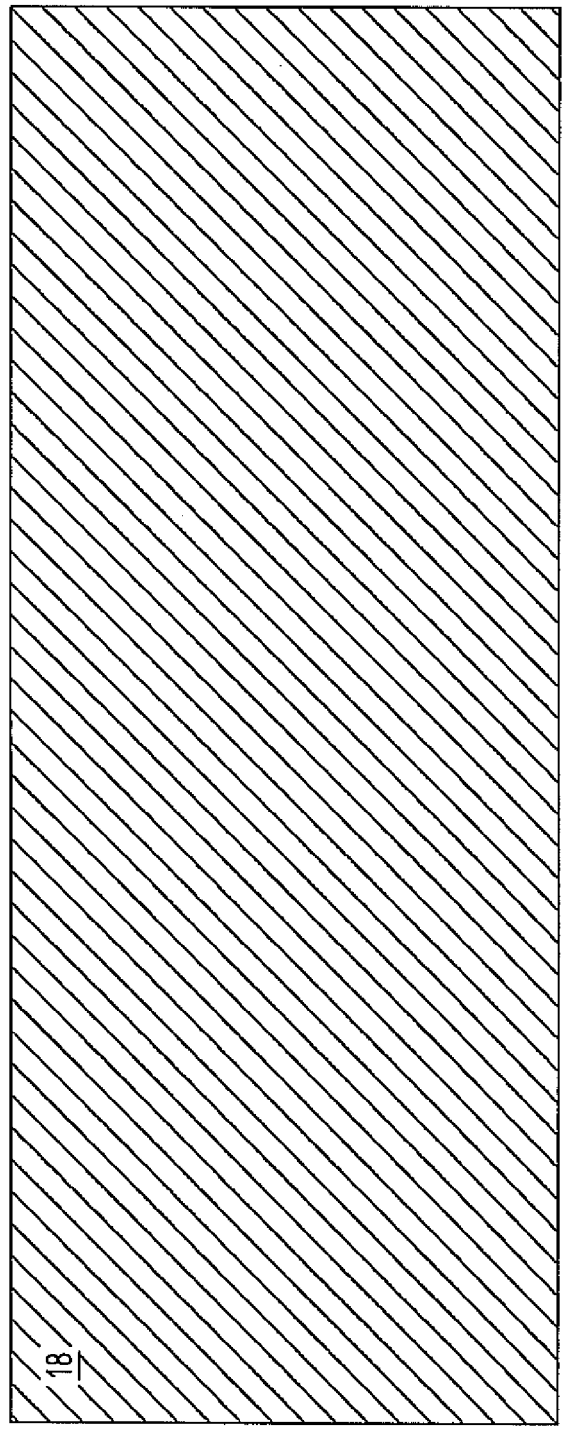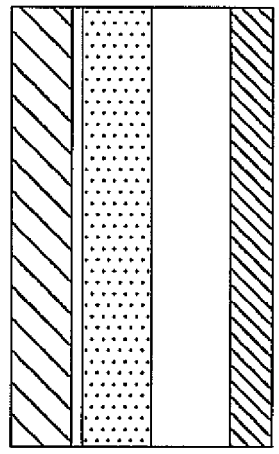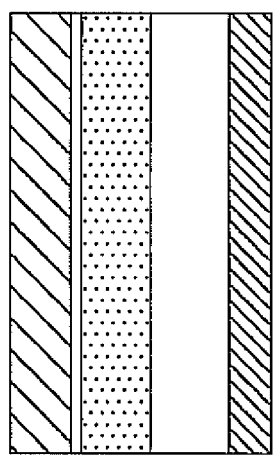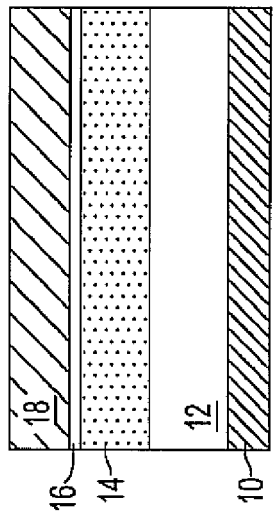

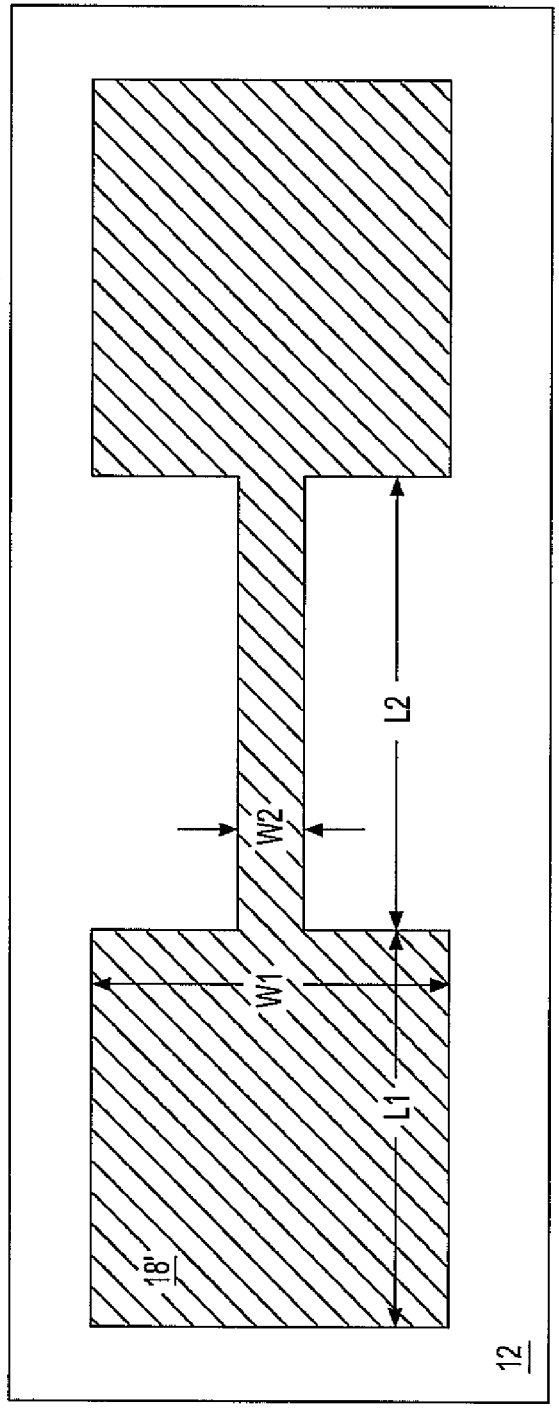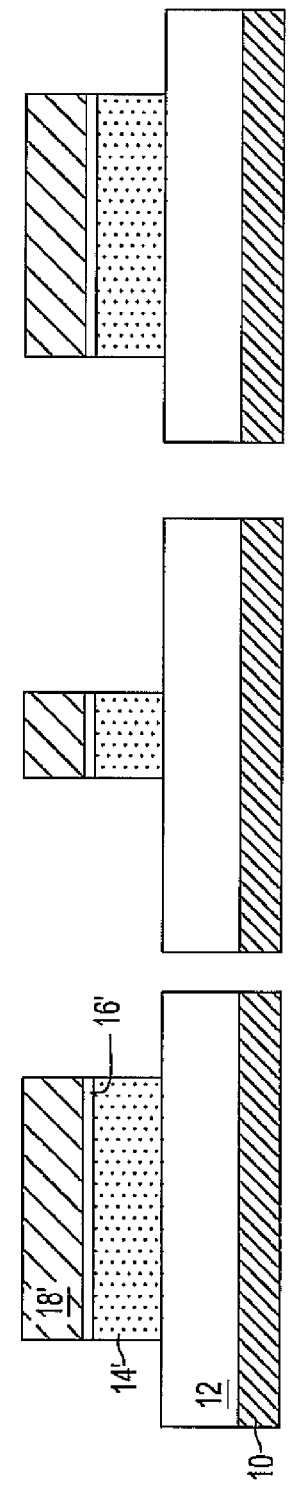

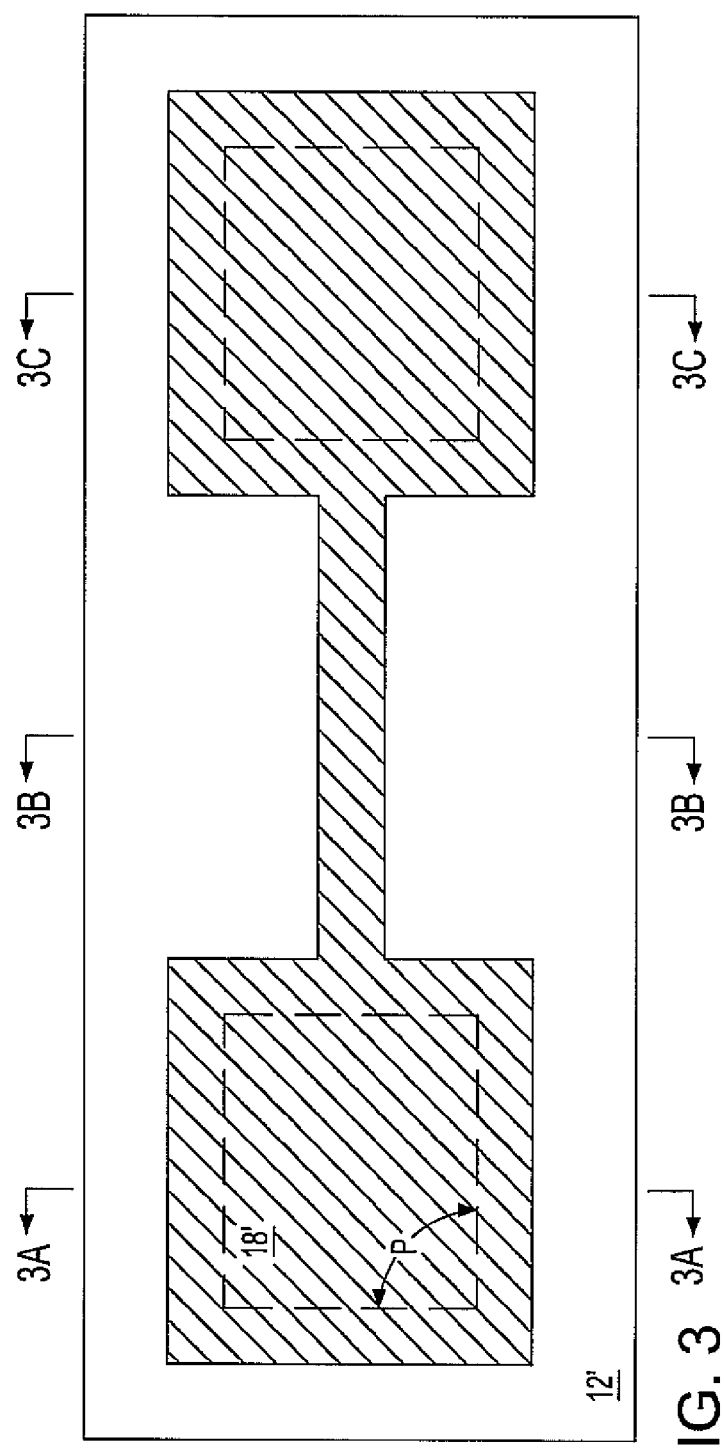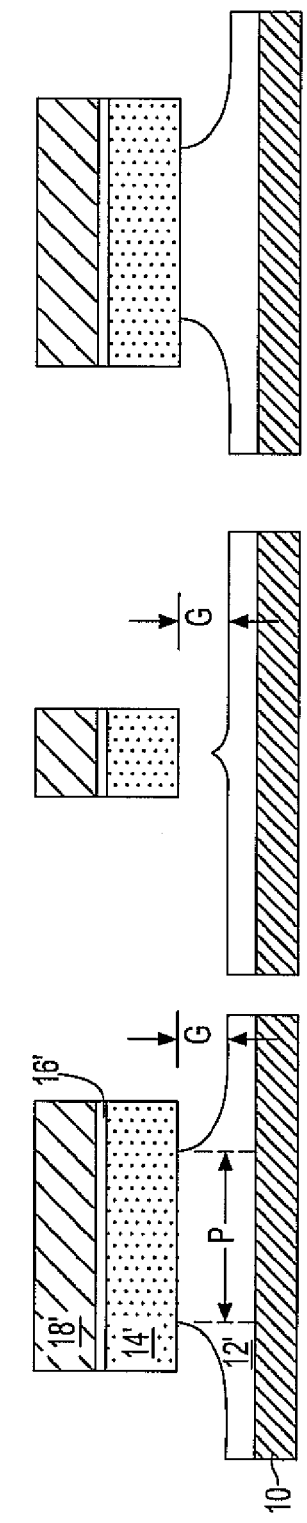

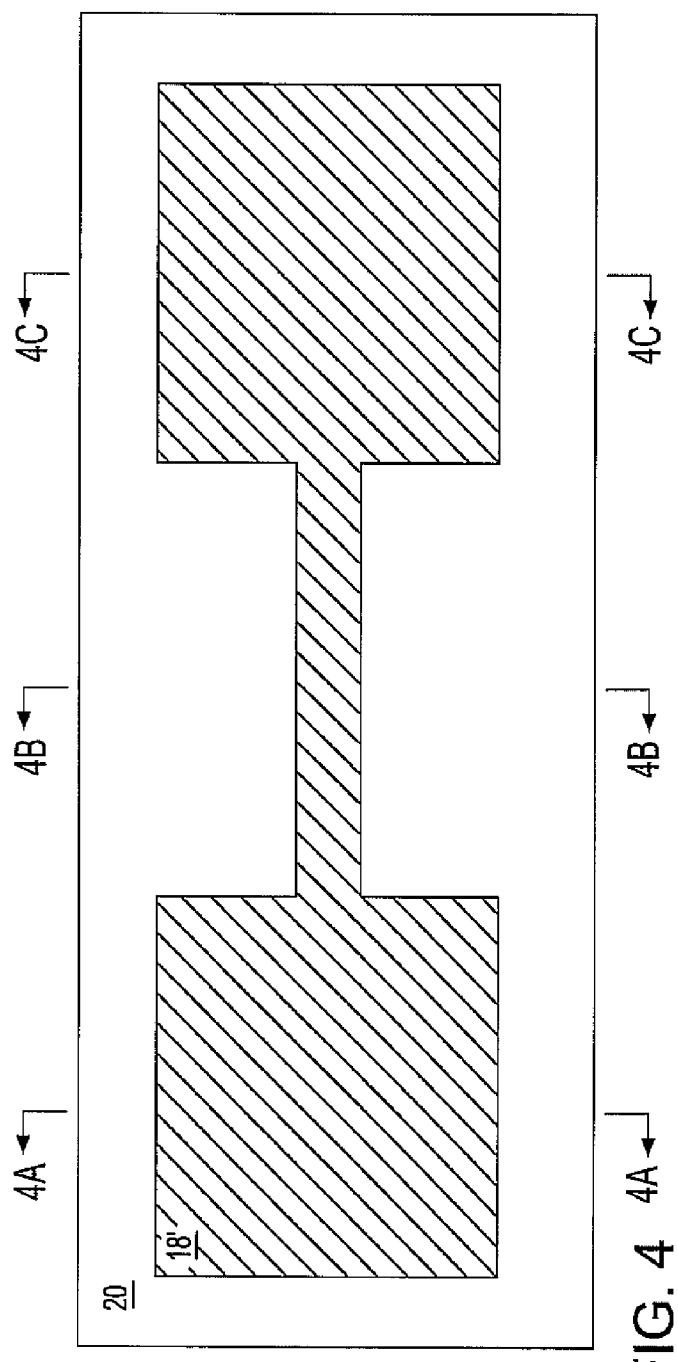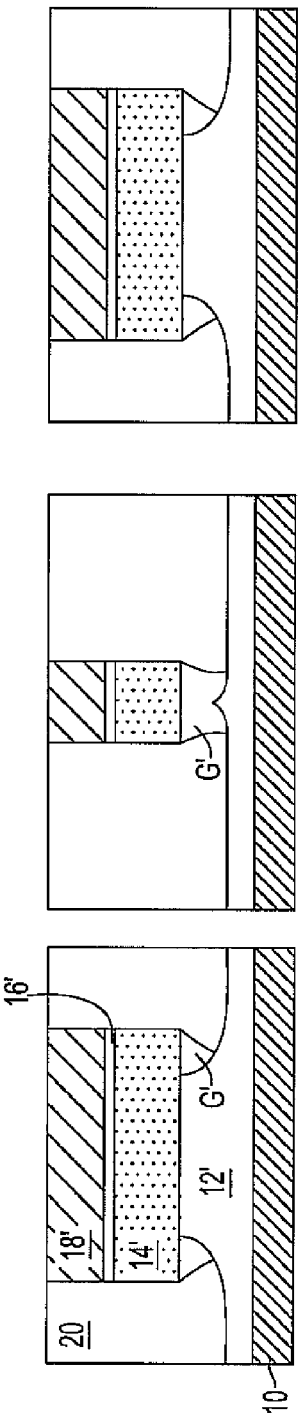

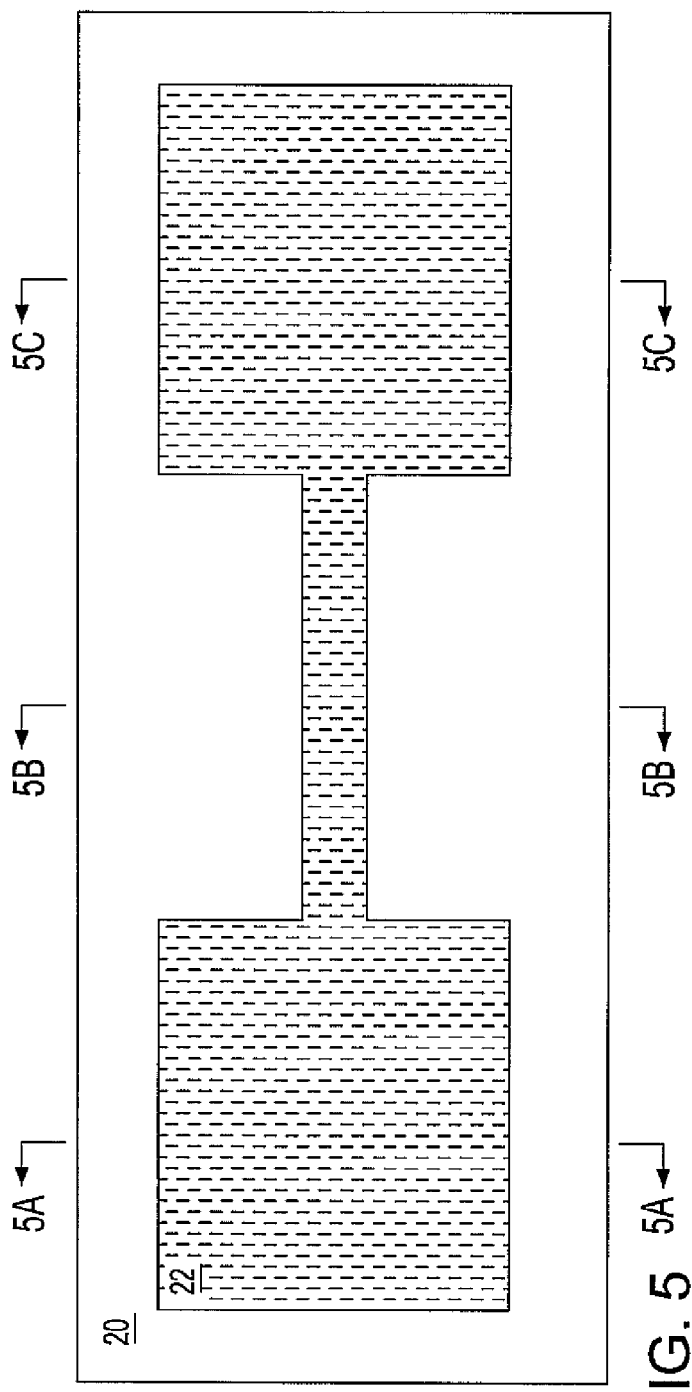
FIG. 5
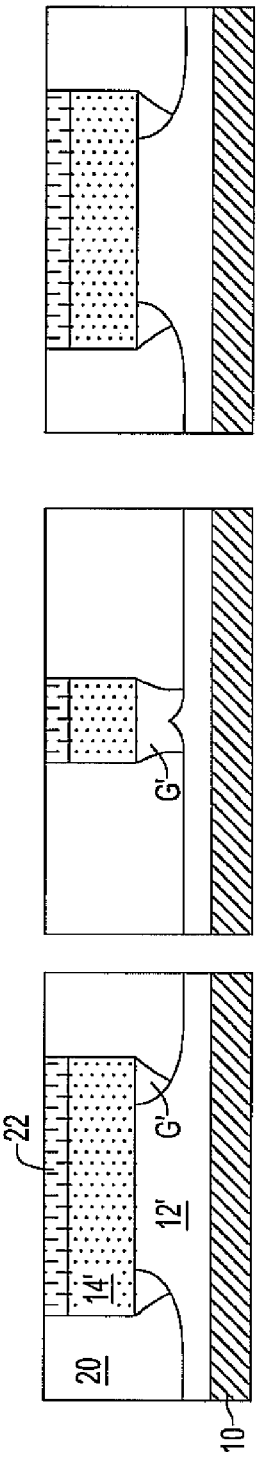
FIG. 5A
FIG. 5B
FIG. 5C

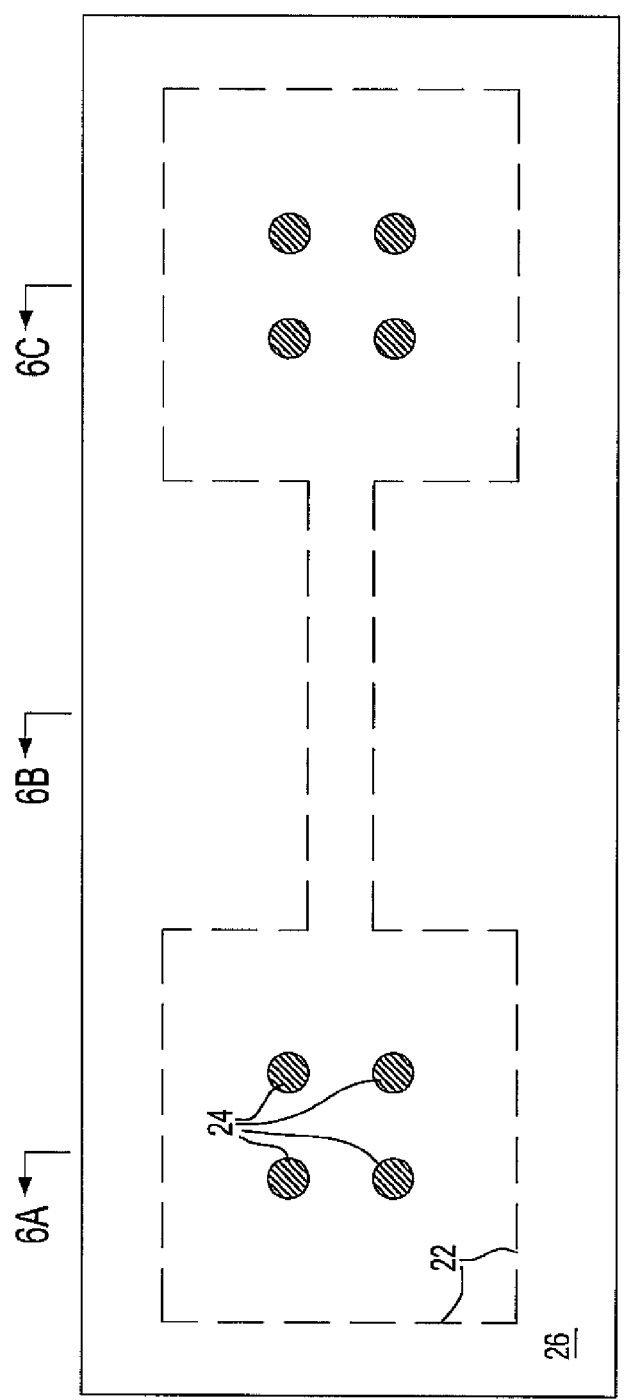
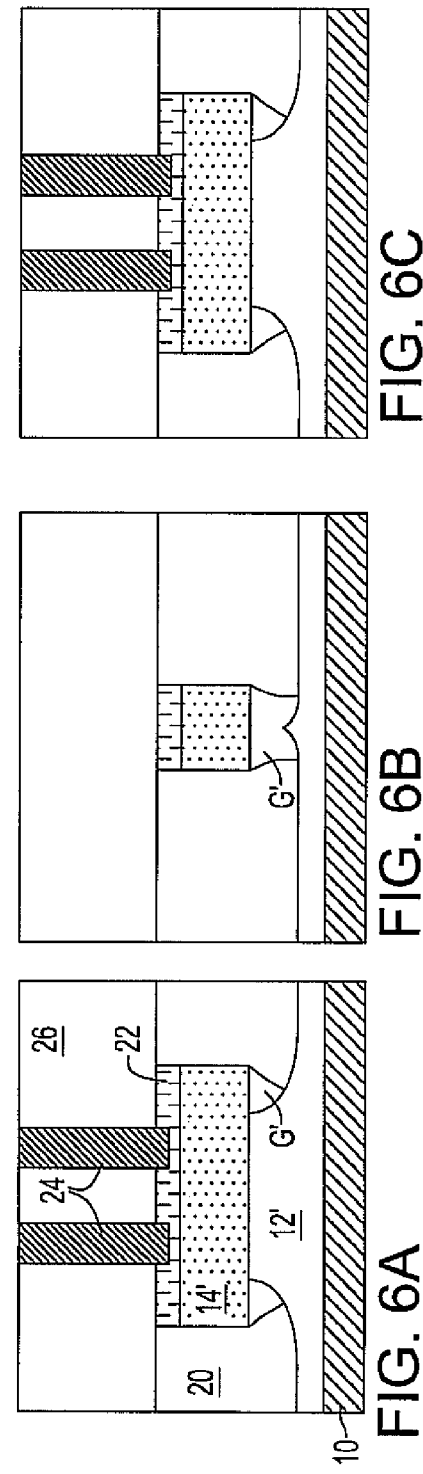

FUSE STRUCTURE INCLUDING MONOCRYSTALLINE SEMICONDUCTOR MATERIAL LAYER AND GAP

BACKGROUND

1. Field of the Invention

The invention relates generally to fuse structures within microelectronic structures. More particularly, the invention relates to enhanced performance fuse structures within microelectronic structures.

2. Description of the Related Art

In addition to transistors, resistors, capacitors and diodes, semiconductor structures and semiconductor circuits often include fuses. Fuses within semiconductor circuits are desirable insofar as fuses provide an efficient means for severing a portion of a semiconductor circuit that may be otherwise defective and unoperational. In particular, fuses are often useful in severing portions of memory array circuits that are otherwise defective and unoperational. Fuses may also be used to electrically trim various semiconductor circuit components, such as variable resistance semiconductor circuit components.

Although fuses are essential within semiconductor circuit fabrication, fuses are nonetheless not entirely without problems. In particular, while providing a means for severing portions of a semiconductor circuit that are defective and unoperational, fuses may not under all circumstances themselves operate efficiently absent defects. For example, in some instances fuses do not always readily program efficiently, particularly under circumstances where a programming current and/or a programming voltage is desired to be low. In some other instances, fuses that have apparently been programmed may nonetheless allow flow of an undesirably high, albeit reduced, current.

Fuses and fuse structures having desirable properties are known in the semiconductor fabrication art.

For example, Kikuchi et al., in U.S. Pat. No. 4,908,692, teaches a semiconductor device that includes a low resistance fuse with desirable programming properties. Within the semiconductor device, the low resistance fuse comprises a high melting point metal silicide material.

In addition, LaFleur et al., in U.S. Pat. No. 5,903,041, teaches an integrated fuse and antifuse structure with enhanced performance for use within a semiconductor structure. The integrated fuse and antifuse structure includes an air gap proximate to a fuse portion thereof.

Further, Arndt et al., in U.S. Pat. No. 6,274,440, teaches a fuse structure that may be fabricated with enhanced process efficiency within a semiconductor structure. The fuse structure includes a gate conductor stack that is located within a gap within the semiconductor structure.

Still further, Kothandaraman et al., in U.S. Pat. No. 6,624,499, teaches a system for programming a silicide fuse with enhanced efficiency within a semiconductor structure. To effect the enhanced efficiency, the system provides a temperature gradient to the silicide fuse when programming the silicide fuse.

Still yet further, Bertin et al., in U.S. Pat. No. 6,633,055 teaches a fuse that may be readily fabricated within a semiconductor structure. This particular fuse may be fabricated from a conductor layer within the semiconductor structure, to provide the fuse that is proximate with a gap.

Still yet further, Anderson et al., in U.S. Pat. No. 6,972,472, teaches yet another fuse structure that may be fabricated within a semiconductor structure. This particular fuse structure includes a fuse element that rises above an insulator layer and is separated from the insulator layer by a gap.

Finally, Kothandaraman et al., in U.S. Pat. No. 7,242,072, teaches yet another fuse structure that may be fabricated within a semiconductor structure. This particular fuse structure uses a crystalline semiconductor layer as a fuse layer substrate.

Since fuses and fuse structures are likely to be of considerable continued importance as semiconductor technology advances, desirable are fuses and fuse structures with enhanced performance for use within semiconductor structures. Such enhanced performance is particularly desired under circumstances where a low fuse programming current is desired.

SUMMARY

The invention provides a fuse structure, a method for fabricating the fuse structure and a method for severing a fuse within the fuse structure. Within the context of the foregoing fuse structure and related methods, the fuse structure includes a fuse material layer (i.e., typically a metal-semiconductor layer such as but not limited to a silicide layer) that functions as a fuse layer located upon a monocrystalline (i.e., single crystalline) semiconductor material layer (i.e., that functions as a fuse substrate layer) located over a substrate. The fuse structure further includes a gap (i.e., typically an air gap) located interposed between the monocrystalline semiconductor material layer and the substrate. Use of a monocrystalline semiconductor material layer as a fuse substrate layer provides enhanced uniformity, in particular, of a metal-semiconductor layer fuse when fabricating the metal-semiconductor layer fuse while using a particular thermal annealing method. Use of the monocrystalline semiconductor material layer as the fuse substrate layer may also provide enhanced uniformity for fuse material layers formed of other fuse materials. Similarly, the inclusion of a gap interposed between the monocrystalline semiconductor material layer and the substrate provides for more uniform thermal control (i.e., and a resulting enhanced thermal gradient) and thus enhanced programming performance when programming the fuse layer.

A fuse structure in accordance with the invention includes a monocrystalline semiconductor material layer located over a substrate and separated from the substrate by a gap. The fuse structure also includes a fuse material layer located upon the monocrystalline semiconductor material layer.

A method for fabricating a fuse structure in accordance with the invention includes patterning a monocrystalline semiconductor material layer located upon a sacrificial layer located over a substrate to form in plan-view a wider end and narrower middle monocrystalline semiconductor material layer aligned upon a wider end and narrower middle sacrificial layer. This particular method also includes etching at least a middle portion of the wider end and narrower middle sacrificial layer from beneath the wider end and narrower middle monocrystalline semiconductor material layer to form a gap interposed between the substrate and at least the narrower middle portion of the wider end and narrower middle monocrystalline semiconductor material layer. This particular method also includes forming upon one of the monocrystalline semiconductor material layer and the wider end and narrower middle monocrystalline semiconductor material layer a fuse material layer.

A method for programming a fuse within a fuse structure in accordance with the invention includes applying a programming current to a fuse material layer located upon a monocrystalline semiconductor material layer located over a substrate, and separated from the substrate by a gap, to provide an increased resistance of the fuse material layer.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, that form a material part of this disclosure, wherein:

FIG. 1 to FIG. 6C show a series of schematic plan-view and corresponding schematic cross-sectional diagrams illustrating the results of progressive stages in fabricating a fuse structure in accordance with a particular embodiment of the invention.

DESCRIPTION OF THE PREFERRED EMBODIMENT

The invention, which includes a fuse structure, a method for fabricating the fuse structure and a method for severing a fuse within the fuse structure, is understood within the context of the description set forth below. The description set forth below is understood within the context of the drawings described above. Since the drawings are intended for illustrative purposes, the drawings are not necessarily drawn to scale.

FIG. 1 to FIG. 6C show a series of schematic plan-view and corresponding schematic cross-sectional diagrams illustrating the results of progressive stages in fabricating a fuse structure within a semiconductor structure in accordance with a particular embodiment of the invention. This particular embodiment of the invention comprises a preferred embodiment of the invention.

FIG. 1 shows a schematic plan-view diagram, and FIG. 1A, FIG. 1B and FIG. 1C show a series of particularly designated corresponding schematic cross-sectional diagrams, of the fuse structure at an early stage in the fabrication thereof in accordance with the preferred embodiment.

FIG. 1A, FIG. 1B and FIG. 1C in particular first show a base semiconductor substrate 10. A buried dielectric layer 12 is located upon the base semiconductor substrate 10. A surface semiconductor layer 14 is located upon the buried dielectric layer 12. In an aggregate, the base semiconductor substrate 10, the buried dielectric layer 12 and the surface semiconductor layer 14 comprise a semiconductor-on-insulator substrate.

The base semiconductor substrate 10 may comprise any of several semiconductor materials, which are generally monocrystalline semiconductor materials. Non-limiting examples include silicon, germanium, silicon-germanium alloy, silicon-carbon alloy, silicon-germanium-carbon alloy and compound (i.e., III-V and II-VI) semiconductor materials. Non-limiting examples of compound semiconductor materials include gallium arsenide, indium arsenide and indium phosphide semiconductor materials. Typically, the base semiconductor substrate 10 has a thickness from about 1 to about 3 mm.

The buried dielectric layer 12 may comprise any of several dielectric materials. Non-limiting examples include oxides, nitrides and oxynitrides, particularly of silicon, but oxides, nitrides and oxynitrides of other elements are not excluded. The buried dielectric layer 12 may comprise a crystalline or a non-crystalline dielectric material, with non-crystalline dielectrics being highly preferred. The buried dielectric layer 12 may be formed using any of several methods. Non-limiting examples include ion implantation methods, thermal or plasma oxidation or nitridation methods, chemical vapor deposition methods and physical vapor deposition methods. Typically, the buried dielectric layer 12 comprises an oxide of the semiconductor material from which is comprised the base semiconductor substrate 10. Typically, the buried dielectric layer 12 has a thickness from about 500 to about 50,000 angstroms.

The surface semiconductor layer 14 may comprise any of the several semiconductor materials from which the base semiconductor substrate 10 may be comprised, with the exception within the instant embodiment that the surface semiconductor layer 14 at least comprises, and may preferably consist essentially of, a monocrystalline (i.e., single crystalline) semiconductor material which may form a metal-semiconductor alloy material upon thermal annealing with a metal-semiconductor alloy forming metal. Such monocrystalline semiconductor materials may include, but are not necessarily limited to, silicon semiconductor materials, germanium semiconductor materials and silicon-germanium alloy semiconductor materials. The surface semiconductor layer 14 and the base semiconductor substrate 10 may thus under certain circumstances comprise either identical or different semiconductor materials with respect to chemical composition, dopant concentration and crystallographic orientation. Typically, the surface semiconductor layer 14 has a thickness from about 100 to about 1,000,000 angstroms (i.e., about 100 um).

The semiconductor-on-insulator substrate that is illustrated most specifically in FIG. 1A, FIG. 1B and FIG. 1C may be fabricated using any of several methods. Non-limiting examples include lamination methods including layer bonding methods, layer transfer methods and separation by implantation of oxygen (SIMOX) (i.e., oxygen ion implantation) methods.

Although the embodiment illustrates the invention within the context of a semiconductor-on-insulator substrate comprising the base semiconductor substrate 10, the buried dielectric layer 12 and the surface semiconductor layer 14, neither the embodiment, nor the invention, is intended to be so limited. Rather, the present invention may alternatively be practiced using a monocrystalline surface semiconductor layer located over other types of base substrates, including in particular base ceramic substrates.

FIG. 1A, FIG. 1B and FIG. 1C (and also FIG. 1 in-part) show a pad dielectric 16 located upon the surface semiconductor layer 14 and a hard mask 18 located upon the pad dielectric 16.

Within the embodiment, the pad dielectric 16 typically comprises an oxide of the semiconductor material from which is comprised the surface semiconductor layer 14. Thus, the pad dielectric 16 typically comprises a silicon oxide, a germanium oxide or a silicon-germanium oxide, although the embodiment is not necessarily so limited. Other materials are not excluded for the pad dielectric 16. The pad dielectric 16 may be formed using any of several methods. Non-limiting examples include thermal oxidation methods, chemical vapor deposition methods and physical vapor deposition methods. Typically, the pad dielectric 16 has a thickness from about 10 to about 200 angstroms.

The hard mask 18 comprises a hard mask material. Non-limiting examples of suitable hard mask materials include silicon nitride materials and silicon oxynitride materials. Such hard mask materials may be formed using methods that are generally conventional in the semiconductor fabrication art. Included in particular, but also not limiting, are chemical vapor deposition methods and physical vapor deposition methods. Typically, the hard mask 18 comprises a silicon nitride material that has a thickness from about 500 to about 10,000 angstroms.

FIG. 2 shows a schematic plan-view diagram illustrating the results of further processing of the semiconductor structure of FIG. 1. FIG. 2A, FIG. 2B and FIG. 2C show particular schematic cross-sectional diagrams that correspond with the schematic plan-view diagram of FIG. 2. In particular, FIG. 2 (in-part), FIG. 2A, FIG. 2B and FIG. 2C illustrate the results of patterning the hard mask 18, the pad dielectric 16 and the surface semiconductor layer 14 to form a corresponding hard mask 18', pad dielectric 16' and surface semiconductor layer 14'. The foregoing patterning is typically effected while using at least in-part: (1) an appropriate patterned photoresist layer which is not specifically otherwise illustrated within FIG. 2, FIG. 2A, FIG. 2B or FIG. 2C as an etch mask; along with (2) appropriate plasma etch method. Such a patterned photoresist layer may comprise any of several photoresist materials. Non-limiting examples of suitable photoresist materials include positive photoresist materials, negative photoresist materials and hybrid photoresist materials that possess characteristics of both positive photoresist materials and negative photoresist materials. Such a mask formed of such a photoresist material is typically formed in the nominal "dogbone" shape that is illustrated in FIG. 2 for the hard mask layer 18'. Within the context of the embodiment and the invention as claimed, the foregoing "dogbone" shape is intended as having wider end portions in comparison with a narrower middle portion.

Within the embodiment, the wider end portions of the dogbone shape are intended as having a width W1 dimension from about 50 to about 3,000 nanometers and a length L1 dimension from about 50 to about 3,000 nanometers. Within the embodiment, the narrower middle portion of the dogbone is intended to have a width W2 dimension from about 10 to about 500 nanometers and a length L2 dimension from about 100 to about 5,000 nanometers.

The foregoing plasma etch method typically uses a series of etchant gas compositions that is appropriate to the materials from which are formed the hard mask 18, the pad dielectric 16 and the surface semiconductor layer 14 that are illustrated in FIG. 1A, FIG. 1B and FIG. 1C. Such a plasma etch method, which is generally an anisotropic plasma etch method, will generally use a fluorine containing etchant gas composition for etching a silicon containing dielectric material, and a chlorine or bromine containing etchant gas composition for etching a silicon, germanium or silicon-germanium alloy semiconductor material. Other materials compositions and etchant gas compositions are not excluded within the context of the embodiment.

FIG. 3 shows a schematic plan-view diagram illustrating the results of further processing of the semiconductor structure whose schematic plan-view diagram is illustrated in FIG. 2. FIG. 3A, FIG. 3B and FIG. 3C illustrate particular schematic cross-sectional diagrams that correspond with the semiconductor structure whose schematic plan-view diagram is illustrated in FIG. 2.

FIG. 3, FIG. 3A, FIG. 3B and FIG. 3C show the results of isotropically etching the buried dielectric layer 12 (which also functions as a sacrificial layer within the context of the claimed invention) to form a buried dielectric layer 12'. As is illustrated most particularly within the schematic cross-sectional diagrams of FIG. 3A, FIG. 3B and FIG. 3C, the buried dielectric layer 12 that is illustrated in FIG. 2A, FIG. 2B and FIG. 2C is isotropically etched to form the buried dielectric layer 12' that includes pedestal regions P that support end portions of the surface semiconductor layer 14' but not a middle portion of the surface semiconductor layer 14'. Instead, as illustrated within the schematic diagram of FIG. 3B, the middle portion of the surface semiconductor layer 14' is separated from the buried dielectric layer 12' and the base semiconductor substrate 10 by a gap G. Typically, the gap G has a gap distance from about 50 to about 5,000 angstroms. As is illustrated within FIG. 3, FIG. 3A and FIG. 3C, the gap G also extends to the pedestal regions P which support what will be contact region portions of surface semiconductor layer 14' However, use of a block mask covering the wider end portions of the hard mask 18', the pad dielectric 16' and the surface semiconductor layer 14' may under certain circumstances desirably preclude formation of the gap G in the pedestal regions.

The foregoing etching to form the buried dielectric layer 12' from the buried dielectric layer 12 may be effected using an isotropic etchant of composition appropriate to the dielectric material from which is comprised the buried dielectric layer 12. When the buried dielectric layer 12 comprises a silicon oxide dielectric material, such an isotropic etchant typically desirably includes a dilute hydrofluoric acid etchant or a dilute buffered hydrofluoric acid etchant. The embodiment is not, however, limited to the foregoing materials compositions.

FIG. 4 shows a schematic plan-view diagram illustrating the results of further processing of the semiconductor structure whose schematic plan view diagram is illustrated in FIG. 3. FIG. 4A, FIG. 4B and FIG. 4C show a series of schematic cross-sectional diagram that particularly correspond with the schematic plan-view diagram of FIG. 4.

FIG. 4, FIG. 4A, FIG. 4B and FIG. 4C show a backfilling dielectric layer 20 that is located and formed to backfill the sidewalls of the hard mask 18', the pad dielectric 16' and the surface semiconductor layer 14'. The backfilling dielectric layer 20 is also planarized with respect to the hard mask layer 18'. The backfilling dielectric layer 20 provides enclosed gaps G' from the gaps G that are illustrated in FIG. 3A, FIG. 3B and FIG. 3C.

The backfilling dielectric layer 20 may comprise any of several backfilling dielectric materials. Such backfilling dielectric materials may be formed using methods including but not limited to thermal or plasma oxidation or nitridation methods, chemical vapor deposition methods and physical vapor deposition methods. From a practical perspective, the backfilling dielectric materials are selected so that they are readily planarizable while using the hard mask 18' as a planarizing stop layer. Thus, within the context of the present embodiment, both the buried dielectric layer 12' and the backfilling dielectric layer 20 will typically comprise a silicon oxide dielectric material, while the hard mask 18', as disclosed above, will typically and preferably comprise a silicon nitride material or a silicon oxynitride material. Other materials compositions are not excluded.

The backfilling dielectric layer 20 may be planarized using any of several methods that are otherwise generally conventional in the semiconductor fabrication art. Included in particular are mechanical planarizing methods and chemical mechanical polish planarizing methods. Chemical mechanical polish planarizing methods are particularly common.

FIG. 5 shows a schematic plan-view diagram illustrating the results of further processing of the semiconductor structure whose schematic plan-view diagram is illustrated in FIG. 4. FIG. 5A, FIG. 5B and FIG. 5C show particular schematic cross-sectional diagrams that correspond with the schematic plan-view diagram of FIG. 5.

FIG. 5, FIG. 5A, FIG. 5B and FIG. 5C first show the results of stripping the hard mask 18' and the pad dielectric 16' from the semiconductor structure whose schematic plan-view diagram is illustrated in FIG. 4 and whose particular corresponding schematic cross-sectional diagrams are illustrated in FIG. 4A, FIG. 4B and FIG. 4C.

The hard mask 18'; and the pad dielectric 16' may be stripped from the semiconductor structures of FIG. 4, FIG. 4A, FIG. 4B and FIG. 4C to provide in-part the semiconductor structures of FIG. 5, FIG. 5A, FIG. 5B and FIG. 5C while using stripping methods and stripping materials that are otherwise generally conventional in the semiconductor fabrication art. For example, and without limitation, when the hard mask 18' comprises a silicon nitride hard mask material or a silicon oxynitride hard mask material, the hard mask 18' may be stripped using an aqueous phosphoric acid etchant material. Similarly, when the pad dielectric 16' comprises a silicon oxide material, the pad dielectric 16' may be stripped with comparatively minimal etching of the backfilling dielectric layer 20, and also selectively with respect to the surface semiconductor layer 14', while using a hydrofluoric acid etchant such as but not limited to a dilute aqueous hydrofluoric acid etchant or a dilute buffered oxide etchant. Other wet chemical etching materials and dry plasma etching materials may also be used for stripping the hard mask 18' and the pad dielectric 16'.

FIG. 5, FIG. 5A, FIG. 5B and FIG. 5C finally show a metal-semiconductor layer 22 located upon the surface semiconductor layer 14'. The metal-semiconductor layer 22 may be formed using any of several metal-semiconductor alloy forming metals. Included in particular are cobalt, nickel, tungsten, titanium, tantalum and platinum metal-semiconductor alloy forming metals, as well as alloys of the foregoing listed metal-semiconductor alloy forming metals. The metal-semiconductor layer 22 may be formed using any of several methods. Included as less common alternatives are chemical vapor deposition methods and physical vapor deposition methods. More particularly desirable are self-aligned silicide type methods (i.e., salicide type methods). Such salicide type methods include: (1) forming a blanket metal-semiconductor forming metal layer upon exposed portions of the surface semiconductor layer 14'; (2) thermally annealing the metal-semiconductor forming metal layer and the surface semiconductor layer 14' to form the metal-semiconductor layer 22 that will typically comprise a silicide layer; and (3) finally stripping unreacted portions of the metal-semiconductor forming metal layer from portions of the backfilling dielectric layer 20. Typically, the metal-semiconductor layer 22, which typically comprises the silicide layer, has a thickness from about 100 to about 1000 angstroms.

Within the context of the instant embodiment, the use of the surface semiconductor layer 14' (i.e., which comprises a monocrystalline semiconductor material layer) is desirable as a substrate layer within a salicide type method for forming the metal-semiconductor layer 22 (i.e., that functions as a fuse layer) since the metal-semiconductor layer is formed more uniformly in comparison with an analogous metal-semiconductor layer that may be formed using a polycrystalline semiconductor material layer as a substrate layer. Such a more uniformly formed metal-semiconductor layer is intended to possess more uniform electrical and physical properties that in turn allow for a more reliable and reproducible programming of the metal-semiconductor layer 22. In addition, the use of the monocrystalline surface semiconductor layer 14' rather than an analogous polycrystalline surface semiconductor layer also provides for more uniform thermal characteristics and a more reproducible thermal gradient when eventually programming a fuse which comprises the metal-semiconductor layer 22 (i.e., typically a silicide layer).

In addition, the gap G' beneath the monocrystalline semiconductor material layer 14' also provides a more uniform thermal barrier that further allows for a more reliable and reproducible programming of the fuse which comprises the metal-semiconductor layer 22.

While FIG. 5, FIG. 5A, FIG. 5B and FIG. 5C illustrate the embodiment within the context of a metal-semiconductor layer 22 as a fuse material layer, the embodiment is not necessarily intended to be so limited. Rather, the embodiment also contemplates use of fuse layers comprising fuse materials other than metal-semiconductor fuse materials. Such other fuse materials may include, but are not necessarily limited to particular metals (such as the metal-semiconductor forming metals listed above) alloys of those metals as listed above, and nitrides of those metals or alloys.

FIG. 6 shows a schematic plan-view diagram illustrating the results of further processing of the semiconductor structure of FIG. 5. FIG. 6A, FIG. 6B and FIG. 6C show particularly designated schematic cross-sectional diagrams that correspond with FIG. 6. FIG. 6, FIG. 6A, FIG. 6B and FIG. 6C first show a passivating dielectric layer 26 located upon the semiconductor structures of FIG. 5, FIG. 5A, FIG. 5B and FIG. 5C. The passivating dielectric layer 26 may comprise passivating dielectric materials that are analogous, equivalent or identical to the passivating dielectric material from which is formed the backfilling dielectric layer 20. Typically, the passivating dielectric layer 26 comprises a silicon oxide dielectric material, although the embodiment is not necessarily so limited. If needed for purposes of providing a planarized surface, such a silicon oxide dielectric material may be planarized using planarizing methods such as but not limited to mechanical planarizing methods and chemical mechanical polish planarizing methods.

FIG. 6, FIG. 6A and FIG. 6C finally show a series of vias 24 located and formed, by implication, into a series of via apertures within the passivating dielectric layer 26. The via apertures in turn expose the metal-semiconductor layer 22. The vias 24 may comprise materials, have dimensions and be formed using methods that are otherwise generally conventional in the semiconductor fabrication art. Typically, the vias 24 comprise a tungsten material, although vias comprised of other materials, including but not limited to aluminum, copper, tantalum and titanium materials, as well as related nitride materials, may also be used. Typically, the vias 24 are formed using a blanket layer deposition method, followed by a planarizing method. Non-limiting examples of blanket layer deposition methods include plating methods, chemical vapor deposition methods and physical vapor deposition methods. Non-limiting examples of planarizing methods include mechanical planarizing methods and chemical mechanical polish planarizing methods.

FIG. 6, FIG. 6A, FIG. 6B and FIG. 6C show a schematic plan-view diagram and a series of corresponding schematic cross-sectional diagrams illustrating a fuse structure within a semiconductor structure in accordance with a preferred embodiment of the invention. The fuse structure includes, located over a substrate which typically but not necessarily comprises a semiconductor substrate 10 within a semiconductor on insulator substrate, a monocrystalline surface semiconductor layer 14' that has a metal-semiconductor layer 22 (i.e., typically a silicide layer) further located thereupon. The metal-semiconductor layer 22 functions as a fuse. Also, the fuse structure includes a gap G' interposed between the substrate 10 (i.e., including the buried dielectric layer 12') and the monocrystalline surface semiconductor layer 14'. Within the embodiment, the use of: (1) the monocrystalline surface semiconductor layer 14' as a substrate when forming the metal-semiconductor layer 22; and (2) the gap G' under the monocrystalline surface semiconductor layer 14', provide for enhanced performance when programming the metal-semiconductor layer 22 that serves as the fuse within the fuse structure. Such enhanced performance is realized in comparison with analogous fuse structures that: (1) use a polycrystalline surface semiconductor layer rather than the monocrystalline surface semiconductor layer 14'; and/or (2) do not use the gap G'.

The embodiment further intends that the fuse structure whose schematic plan-view and cross-sectional diagrams are illustrated in FIG. 6, FIG. 6A, FIG. 6B and FIG. 6C may be programmed incident to application of an appropriate programming current (i.e., from about 1 to about 30 milliamps) at an appropriate programming voltage to vias 24 specifically located as illustrated in FIG. 6, FIG. 6A and FIG. 6C. The embodiment further intends that when programming the fuse from which is comprised the metal-semiconductor layer 22, a programming current and programming voltage are used such as to provide a comparatively uniform electromigration of metal-semiconductor material (i.e., typically silicide material) within the metal-semiconductor layer 22 and an increase in resistance of the metal-semiconductor layer 22. As a result of such a controlled electromigration and controlled programming of the metal-semiconductor layer 22, a discontinuous rupture of the metal-semiconductor layer 22 is desirably avoided.

The instant embodiment, which comprises a preferred embodiment, is illustrative of the invention rather than limiting of the invention. Revisions and modifications may be made to methods, materials, structures and dimensions of a fuse structure in accordance with the preferred embodiment, while still providing a fuse structure, a method for fabrication thereof and a method for operation thereof in accordance with the invention, further in accordance with the accompanying claims.

What is claimed is:

1. A method for fabricating a fuse structure comprising:
    patterning a monocrystalline semiconductor material layer located upon a sacrificial layer located over a substrate to form in plan-view a wider end and narrower middle monocrystalline semiconductor material layer aligned upon a wider end and narrower middle sacrificial layer;
    etching a narrow middle portion of the wider end and narrower middle sacrificial layer from beneath the wider end and narrower middle semiconductor material layer to provide a gap interposed between the narrow middle portion of the wider end and narrower middle monocrystalline semiconductor material layer and the substrate, wherein said etching further leaves a pedestal of the wider end and narrower middle sacrificial layer recessed under a wider end portion of the wider end and narrower middle semiconductor material layer and wherein said etching thus also extends the gap to include a location under a periphery of the wider end portion of the wider end and narrower middle semiconductor material layer; and
    forming a fuse material layer upon one of:
        the monocrystalline semiconductor material layer, and sequentially patterning the fuse material layer when patterning the monocrystalline semiconductor material layer; and
        the wider end and narrower middle monocrystalline semiconductor material layer, said fuse material layer comprising a metal-semiconductor material.

2. A method for fabricating a fuse structure comprising:
    patterning a monocrystalline semiconductor material layer located upon a sacrificial layer located over a substrate to form in plan-view a wider end and narrower middle monocrystalline semiconductor material layer aligned upon a wider end and narrower middle sacrificial layer;
    etching at least a narrow middle portion of the wider end and narrower middle sacrificial layer to provide a gap between at least the narrow middle portion of the wider end and narrower middle monocrystalline semiconductor material layer and the substrate; and
    forming a fuse material layer upon one of:
        the monocrystalline semiconductor material layer, and sequentially patterning the fuse material layer when patterning the monocrystalline semiconductor material layer; and
        the wider end and narrower middle monocrystalline semiconductor material layer.

3. The method of claim 2 wherein the fuse material layer comprises a metal-semiconductor material.

4. The method of claim 2 wherein the etching leaves a pedestal of the wider end and narrower middle sacrificial layer under a wider end portion of the wider end and narrower middle semiconductor material layer.

5. The method of claim 4 wherein the etching also leaves a gap under a wider end portion of the wider end and narrower middle semiconductor material layer.

6. The method of claim 4 wherein the etching does not leave a gap under a wider end portion of the wider end and narrower middle semiconductor material layer.

7. A method for fabricating a fuse structure comprising:
    providing a substrate including a vertical stack of a surface semiconductor layer, a base dielectric layer, and a base semiconductor layer;
    patterning said surface semiconductor layer into a shape including a narrower middle portion, a first end portion laterally abutting said narrower middle portion and having a greater width than said narrower middle portion, and a second end portion laterally abutting said narrower middle portion and not abutting said first end portion and having a greater width than said narrower middle portion; and
    isotropically etching exposed portions of said base dielectric layer, wherein an entirety of a bottom surface of said narrower middle portion is exposed between said first end portion and said second end portion, and wherein a portion of said base dielectric layer abuts a portion of a bottom surface of said first end portion and another portion of said base dielectric layer abuts a portion of a bottom surface of said second portion after said isotropically etching.

8. The method of claim 7 further comprising depositing a backfilling dielectric layer on said patterned surface semiconductor layer, wherein a gap separating said entirety of said bottom surface of said narrower middle portion and said base dielectric layer is formed after said depositing of said backfilling dielectric layer.

9. The method of claim 8 further comprising:
    planarizing said backfilling dielectric layer;
    exposing a top surface of said patterned surface semiconductor layer; and
    forming a metal semiconductor layer directly on said top surface of said patterned surface semiconductor layer.

10. The method of claim 7 wherein said surface semiconductor layer is a monocrystalline semiconductor material layer.

11. The method of claim 7 further comprising:
    forming a pad dielectric on said surface semiconductor layer; and
    forming a hard mask on said pad dielectric.

* * * * *